US 6,535,725 B2

(12) United States Patent
Hatcher et al.

(10) Patent No.: US 6,535,725 B2
(45) Date of Patent: Mar. 18, 2003

(54) INTERFERENCE REDUCTION FOR DIRECT CONVERSION RECEIVERS

(75) Inventors: Geoffrey Hatcher, Irvine, CA (US); Alyosha C. Molnar, Mesa, CA (US); Rahul Magoon, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/823,313

(22) Filed: Mar. 30, 2001

(65) Prior Publication Data

US 2002/0160740 A1 Oct. 31, 2002

(51) Int. Cl.[7] .................................................. H04B 1/10
(52) U.S. Cl. ........................ 455/317; 455/310; 455/324
(58) Field of Search ............................ 455/296, 310, 455/311, 317, 324, 333, 226.1, 313, 316, 323; 375/316, 346

(56) References Cited

U.S. PATENT DOCUMENTS

| 5,140,699 A | * | 8/1992 | Kozak ........................... 455/296 |
| 5,241,702 A | * | 8/1993 | Dent ............................. 455/296 |
| 5,749,051 A | * | 5/1998 | Dent ............................. 455/324 |
| 6,006,079 A | * | 12/1999 | Jaffee et al. ................ 455/324 |
| 6,009,126 A | * | 12/1999 | Van Bezooijen ............ 375/316 |
| 6,311,051 B1 | * | 10/2001 | Jung ............................. 455/296 |

* cited by examiner

*Primary Examiner*—Lester G. Kincaid
(74) *Attorney, Agent, or Firm*—Thomas, Kayden, Horstemeyer & Risley, LLP

(57) ABSTRACT

The DC offset compensator compensates DC offsets resulting from interferor self mixing and interferor interaction with even-order nonlinearities. In one embodiment, the DC offset compensator resides in a mobile communication device. A radio frequency (RF) communication signal is mixed with a local oscillator signal (LO) in a direct conversion mixer. The communication signal, at certain times, will have both a communication signal of interest and interferor signals. The interferor signals induce signals in other portions of the mixer circuit, called interferor leakage signals, and the interaction between the two signals causes undesirable DC offsets in the mixer output. The DC offset compensator detects the presence of the interferor signals and provides a compensating signal to the output of the mixer such that the undesirable DC offset signals caused by the interferer self mixing and interferor interaction with even order-nonlinearities in the mixer are compensated out of the mixer output signal.

21 Claims, 9 Drawing Sheets

INTERFERENCE REDUCTION FOR DIRECT CONVERSION RECEIVERS

BACKGROUND OF THE INVENTION

1. Field of the Invention

This invention relates generally to radio frequency (RF) receivers and, more particularly, to compensate undesirable DC offset present in mixers.

2. Related Art

To optimally process radio frequency (RF) signals, most RF receivers convert received RF signals to lower frequencies termed baseband frequencies. The filtering and amplification performed in processing the RF signal at baseband frequency requires less expensive electrical components than those required for accurate processing at RF. Typically, RF receivers employ mixers to convert the received RF signal to a lower frequency while conserving the modulation information contained in the received signal. Frequency shifting occurs by mixing, or taking the difference between, the received RF signal and a reference frequency from a local oscillator (LO). The difference between the RF signal and the LO frequency is the lower frequency or baseband frequency.

The process of converting the RF signal to a lower frequency is called downconverting. The RF receiver functions to downconvert a received RF signal to baseband. Direct conversion receivers directly downconvert the received RF signal to baseband by mixing the received RF signal with a LO frequency equal to the received RF frequency.

An example of a conventional mixer is the commonly known "Gilbert cell." The mixer includes a plurality of transistors and a RF input section. Input to the Gilbert cell is a LO signal, such as a voltage, where the oscillation of the LO signal causes a current to commutate between pairs of transistors. This commutation action produces a mixing of the RF signal with the local oscillator signal to produce an output baseband signal that is a downconverted received RF signal. The baseband signal contains the information of interest. In some communication standards (including many wireless standards), information is present at direct current (DC).

When a differential signal is used, there is always a DC offset present. As mentioned above, in some standards, the desired information is present at DC. Thus, the inherent DC offset present in the circuit must be extracted or removed from the DC present in the desired information. There are several mechanisms in which the DC offset may introduce undesirable interference in a direct conversion receiver. The first is the LO leakage (coupling) back to the RF input due to the proximity of the LO circuitry to the RF circuitry. Since LO strength is typically kept constant, the resulting DC offset from LO leakage does not change with time. Such an offset is known as a static DC offset.

Second, interferer signals, also known as blockers, may leak onto the LO input. Examples of interferer signals include, but are not limited to, signals from other nearby communication devices using portions of the frequency spectrum that are relatively close to the frequency spectrum employed by the RF signal that is downconverted by the direct conversion receiver. Another common interferor in wireless standards is from the transmitting unit in the same communicating device. The signal leaking onto the LO input that is associated with the intereferor signal is known as an interferor leakage signal. Therefore, the interferer leakage signal on the LO input mixes down with the interferer signal present at the RF input of the mixer to yield a DC offset at the output of the mixer that varies with interferer signal strength. Because the resulting DC offset varies with the strength of the interferer signal, this DC offset is a dynamic DC offset.

Third, even-order nonlinearities in the mixer may introduce significant distortion in direct conversion receivers. The direct conversion receiver employs a plurality of transistors fabricated on a single chip. If the physical parameters including area and doping concentrations of transistors are not symmetric, then the differences, however small, results in the transistors performing differently from the ideal transistor. In practical applications of conventional integrated circuit (IC) transistor on-chip fabricating processes, all transistors are at least slightly different from each other in that no two transistors can be identically fabricated down to the molecular level. Mismatches in the transistor pairs of a Gilbert cell mixer yields two types of DC offsets at the mixer output: static and dynamic. Static DC offsets are dealt with easily using techniques and apparatus well known in the art. However, dynamic DC offsets caused by the even-order nonlinearities are not adequately compensated for in conventional systems. The fourth interference mechanism occurs from mismatches at the direct conversion receiver mixer load. This interference mechanism, yields static DC offsets. Compensation for this interference mechanism is well known.

Within the communication industry, significant efforts continue to attempt to minimize the undesirable interference and/or signal distortions caused by the above interference mechanisms resulting from the DC offset. Therefore, there is an on-going need to continue to further minimize the impact of these mechanisms, and particularly, the dynamic DC offsets associated with interferor signals (the second and third mechanisms above), so that direct conversion receivers for wireless standards may be fabricated using IC technologies.

SUMMARY

The invention is a DC offset compensator that compensates for dynamic direct current (DC) offsets resulting from the interferer signal accompanying an incoming RF communications signal interacting with the associated interferer leakage signal appearing on the local oscillator (LO) input to the mixer, as well as dynamic DC offsets associated with the even-order nonlinearities caused by differences in transistors fabricated on the mixer chip.

In one embodiment, the DC offset compensator is employed in a mobile communication device. An incoming radio frequency (RF) communications signal is mixed with a local oscillator signal (LO) in a direct conversion mixer. The incoming communication signal, at times, has both a communication signal of interest and other communication signals, known as interferor signals (also known as blocker signals). The interferer signal induces undesirable DC offset at the output of the mixer via two mechanisms: self-mixing between the interferor signal and an associated interferer leakage signal, and interaction with even-order nonlinearities present in the mixer.

The DC offset compensator detector detects the presence of the interferer signals and provides a compensating correction to the output of the mixer such that some or all of the undesirable DC offset caused by the interferer leakage signals are removed (compensated out) of the mixer output signal. In one embodiment, the DC offset compensator detects the presence of interferer signals directly from the incoming RF communication signal. Other embodiments of the DC offset compensator detect changes in the common mode current of the mixer. Other embodiments of the DC offset compensator are employed in other devices that have receivers, such as, but not limited to, televisions, radios, stereo receivers, satellite receivers, or the like. Furthermore, alternative embodiments of the DC offset compensator are coupled to other types of circuitry in a system having undesirable DC offsets.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

1. Overview of the DC Offset Compensator

Figure 1:
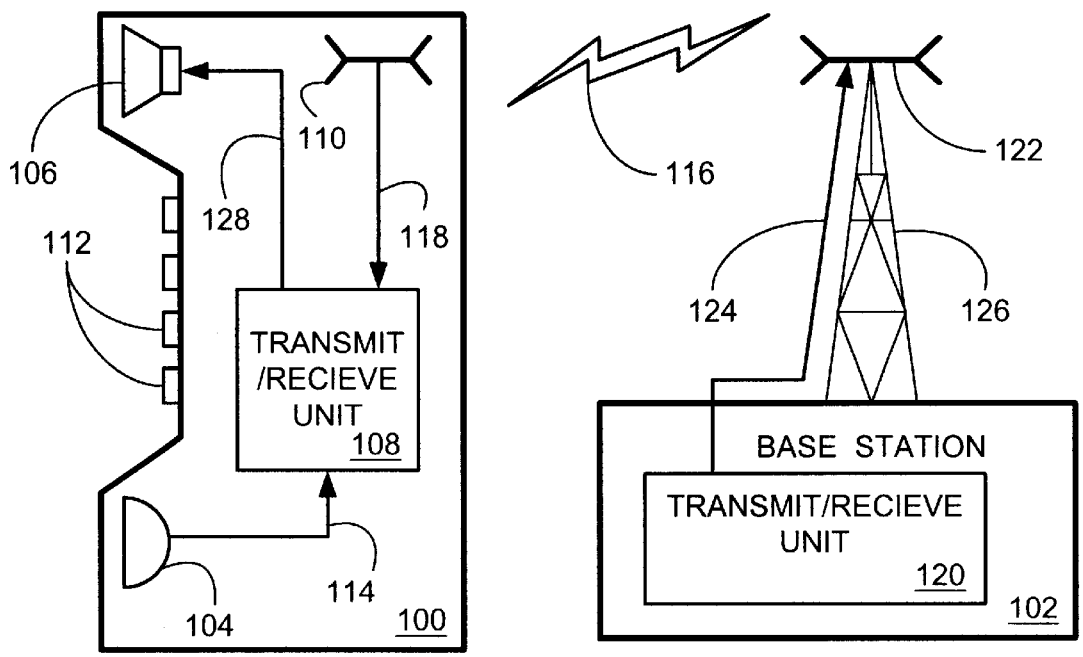
FIG. 1 is a simplified block diagram of a mobile communication device communicating with a base station.

FIG. 1 is a simplified block diagram of a mobile communication device 100 communicating with a base station 102. Mobile communication device 100, also known as a wireless communication device, typically has a microphone 104, a speaker 106, a transmit/receive unit 108 and an antenna 110. To initiate a voice conversation, a user actuates keys 112 on a keypad to transmit a destination code, such as a telephone number, to the transmit/receive unit 108. The user's voice, detected by microphone 104 and communicated to the transmit/receive unit 108 via connection 114, is transformed into a radio frequency (RF) communication signal 116 by the transmit/receive unit 108, and then transmitted by antennae 110, via connection 118, to base station 102.

Communications destined to the mobile communication device 100 are transformed into an RF communication signal by the transmit/receive unit 120 and transmitted onto base station antenna 122 via connection 124. Base station antennae 124 is typically set up on a tower 126 or other similarly situated high point for better transmission and reception. The RF communication signal 116 is then transmitted to the mobile communication device 100. The received RF communication signal 116 is detected by antennae 110, then travels to the receiver/transmitter 108 via connection 118. The receiver/transmitter 108 converts the received RF communication signal into a signal that is transmitted to speaker 106, via connection 128. Thus, once the base station 102 has established connectivity to the destination location (not shown), as defined by the telephone number, a person using mobile communication device 100 carries on a voice telephone conversation (or another communication such as, but not limited to, a facsimile transmission, e-mail or the like) with another person at the destination location.

Figure 2:
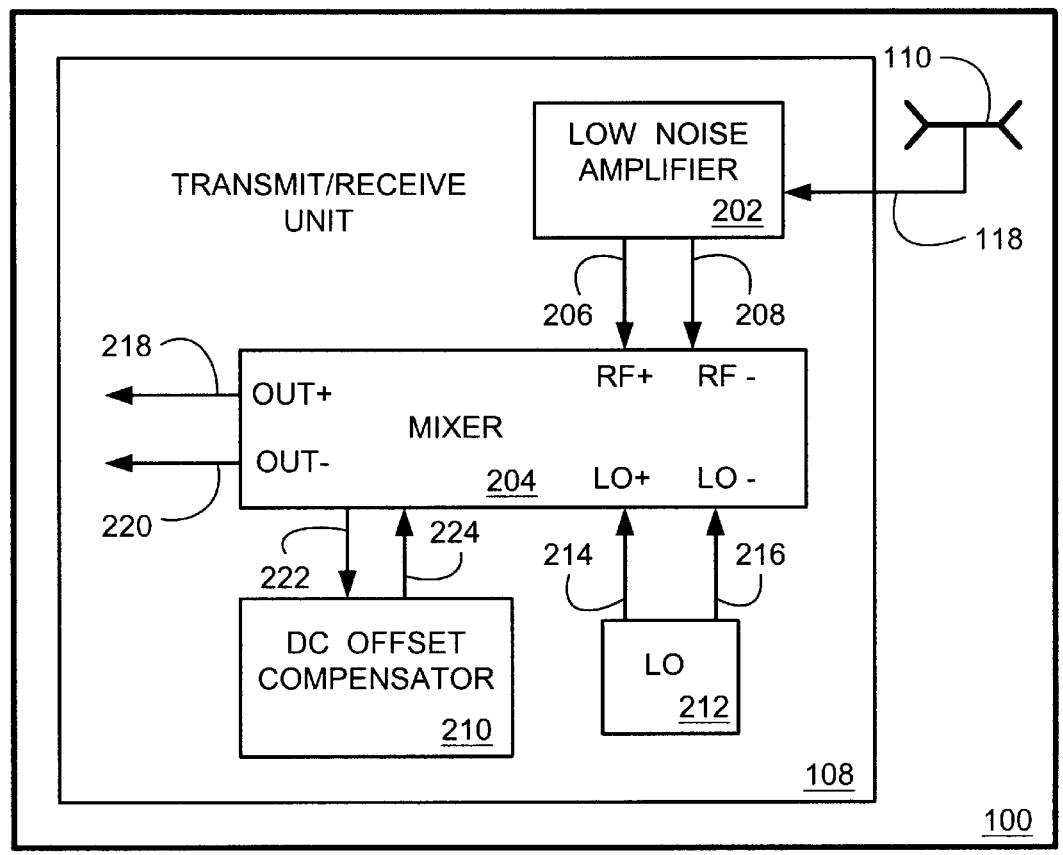
FIG. 2 is a block diagram illustrating selected receiver components of the mobile communication device of FIG. 1.

FIG. 2 is a block diagram illustrating selected receiver components of the mobile communication device 100. The RF communication signal 116 (FIG. 1) detected at antenna 110 is communicated to the low noise amplifier (LNA) 202, via connection 118. LNA 202 provides an amplified RF communication signal, RF+ and RF−, to mixer 204 over connections 206 and 208, respectively. LNA amplifier 202 is well known in the art and may be implemented using well known components and techniques employed in the art of detecting and amplifying RF signals. Detailed operation of LNA 202 is not described in detail other than to the extent necessary to understand the operation and functioning of LNA 202 when employed as part of a transmit/receive unit 108 that is compensated by DC offset compensator 210. Any such well known LNA 202 may be implemented in a transmit/receive unit 108 without departing substantially from the functionality and operation of the DC offset compensator 210 described below. Furthermore, for convenience of illustration in FIG. 2, LNA 202 is shown residing within the transmit/receive unit 108. LNA 202 may also reside in alternative convenient locations outside of the transmit/receive unit 108, as components of other systems, or as a stand-alone dedicated low noise amplifier without adversely affecting the operation and functionality of the DC offset compensator 210 described below.

Mixer 204, an electronic circuit, directly mixes the received RF communication signal, RF+ and RF−, with a signal provided by local oscillator (LO) 212. LO 212 provides LO+ and LO− and signals to mixer 204 via connections 214 and 216, respectively. Mixer 204 and LO 212 are well known in the art and may be implemented using any well known components and techniques employed in the art of mixing RF communication signals with oscillator signals. Detailed operation of mixer 204 and LO 212 are not described in detail other than to the extent necessary to understand the operation and functioning of mixer 204 and LO 212 when employed as part of a transmit/receive unit 108 that is compensated by DC offset compensator 210. Any such well-known mixer 204 and/or LO 212 may be implemented in a transmit/receive unit 108 without departing substantially from the functionality and operation of the DC offset compensator 210 described below. Furthermore, for convenience of illustration in FIG. 2, mixer 204 and LO 212 are shown residing within the transmit/receive unit 108. Mixer 204 and/or LO 212 may also reside in alternative convenient locations outside of the transmit/receive unit 108, as components of other systems, or as a stand-alone dedicated mixer or local oscillator without adversely affecting the operation and functionality of the DC offset compensator 210 described below.

Mixer 204 generates output signals (OUT+ and OUT−) by combining the incoming RF communication signal (RF+ and RF−) and the LO signal (LO+ and LO−), referred to as downmixing. (The mixer 204 output current includes other well known components, such as, but not limited to a bias current.) Output signals (OUT+ and OUT−), a differential signal OUT, are output from mixer 204 over connections 218 and 220 (respectively) for transmission to other components (not shown) residing in the transmit/receive unit 108 for additional processing and/or amplification. In one embodiment of the mobile communication device 100, mixer 204 employs a Gilbert cell, described below, to downmix RF communication signals (RF+ and RF−) with local oscillator signals (LO+ and LO−) to generate the output signals (OUT+ and OUT−).

DC offset compensator 210 is coupled to mixer 204, via connection 222, so that interferer signals may be detected. DC offset compensator 210, described below, provides a compensation signal via connection 224 to the mixer 204 so that the undesirable dynamic DC offset caused by interferor signals are compensated out of the communication signal. For convenience of illustration, the connections 222 and 224 are illustrated as a single connection. As described below, connections 222 and 224 are, in one embodiment, each two connections.

2. DC Offset Compensator Functional Components

Figure 3:
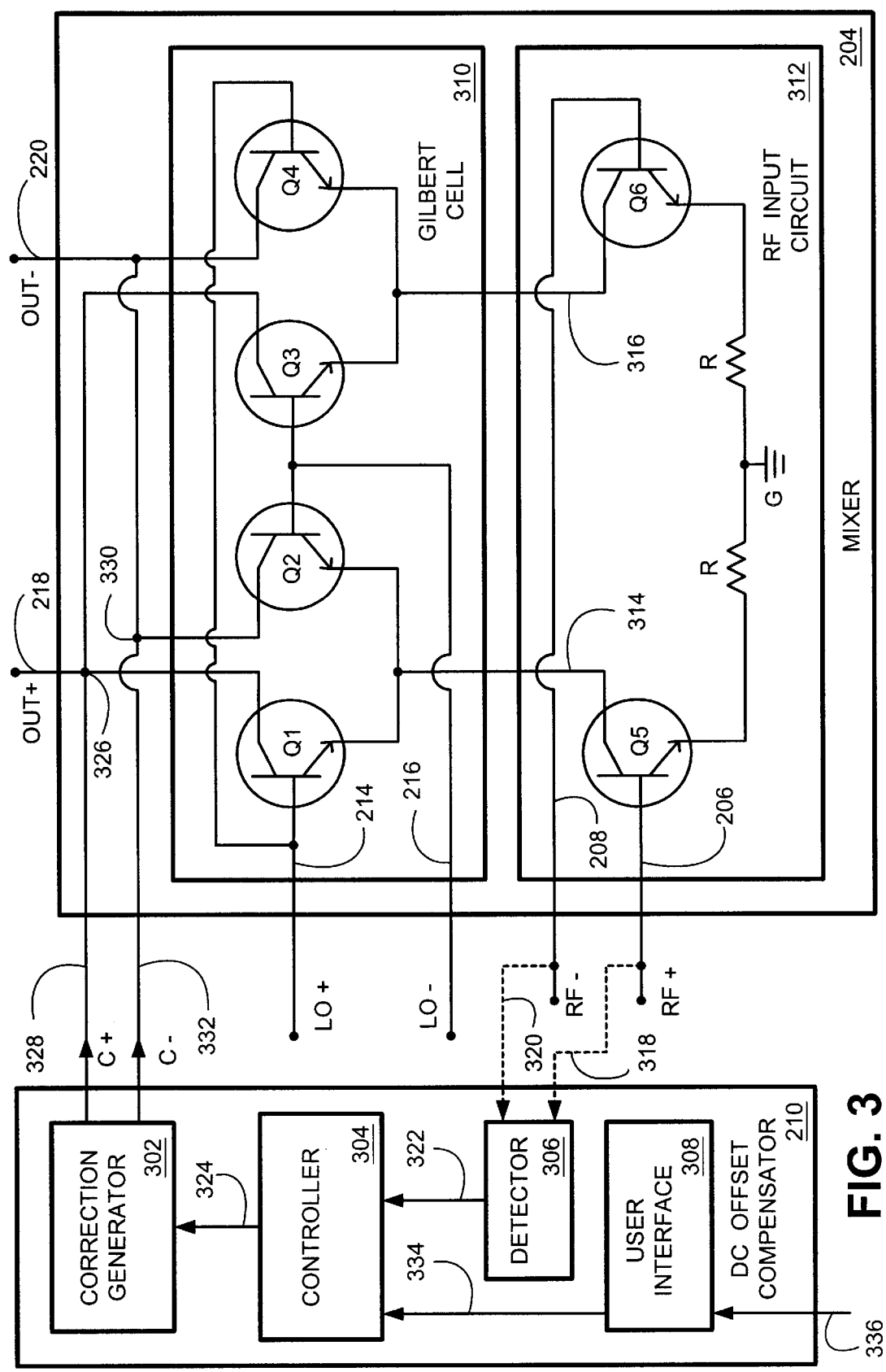
FIG. 3 is a block diagram of the DC offset compensator residing in the mobile communication device of FIG. 1 and coupled to a mixer of FIG. 2.

FIG. 3 is a block diagram of the DC offset compensator 210 residing in the mobile communication device 100 (FIGS. 1 and 2) coupled to mixer 204. DC offset compensator 210 includes a correction generator 302, a controller 304, detector 306 and user interface 308. The DC offset compensator 210 is coupled to mixer 204, a conventional direct conversion mixer. Mixer 204 includes the well known Gilbert cell 310 and an RF input circuit 312.

The Gilbert cell 310 employs four transistors Q1, Q2, Q3 and Q4. Gilbert cell 310 is coupled to RF input circuit 312, via connections 314 and 316. Gilbert cell 310 is coupled to the LO 212 (FIG. 2) via connections 214 and 216. The output of mixer 204 (OUT+ and OUT−) is provided from the Gilbert cell 310 via connections 218 and 220, respectively. RF input circuit 312 employs two transistors Q5 and Q6. Also included in the RF input circuit 312 are resistors (R) to provide coupling to a suitable grounding point (G). RF input circuit 312 receives the input RF signal (RF+ and RF−) over connections 206 and 208, respectively. When the user of the mobile communication device 100 (FIGS. 1 and 2) is using the device for communications, RF communication signals are detected and then amplified by the low noise amplifier 202 (FIG. 2). The incoming RF signal (RF+ and RF−) contains at least the communication signal of interest. At times, an interferer signal may also be present in the incoming RF communication signal.

Detector 306 is coupled to connections 206 and 208, via connections 318 and 320, respectively, so that the interferor signals, if present in the incoming RF communication signal, may be detected by the DC offset compensator 210. Detector 306 provides a suitable control signal corresponding to the interferor signal to controller 304 over connection 322. Controller 304 then provides a suitable signal to correction generator 302, via connection 324. Correction generator 302 generates a compensating correction (C+ and C−) (and combines the compensating correction with the differential signal path (OUT+ and OUT−, respectively) so that the DC offset caused by the interferer signal is significantly reduced or eliminated (compensated). Correction generator 302 is coupled to connection 218 at node 326, via connection 328, such that the compensating signal C+ can be combined with the output differential signal path OUT+. Similarly, correction generator 302 is coupled to connection 220 at node 330, via connection 332, such that the compensating correction C− is combined with the output signal OUT−. Compensating signals C+ and C− may be any suitable signal, such as, but not limited to, a suitable voltage or a suitable current. Thus, DC offset compensator 210 employs detector 306 to detect an interferor signal, employs controller 304 to generate a control signal, and employs correction generator 302 to generate a suitable compensating signal (C+ and C−) that is combined with the output (OUT+ and OUT−) at nodes 326 and 330.

DC offset compensator 210 includes user interface 308. User interface 308 is coupled to controller 304, via connection 334, such that a user may provide suitable instructions, via connection 336, such that controller 304 specifies a desired signal to be generated by correction generator 302 so that the DC offset caused by the interferer signal can be compensated. An alternative embodiment, described below, employs a means to detect the presence and magnitude of an interferer signal, or a suitable test tone signal, and automatically provide an input signal to controller 304 such that the appropriate gains are set in the controller 304.

3. Even-Odd Nonlinearity Effect

During the fabrication process of the Gilbert cell 310 (FIG. 3), the transistors Q1, Q2, Q3 and Q4 are designed such that the oscillator signal (LO+ and LO−) is mixed with the incoming RF signal (RF+ and RF−) such that a suitable output signal (OUT+ and OUT−) is output by the mixer 204 (FIGS. 2 and 3). Transistors Q1, Q2, Q3 and Q4 are intended to be fabricated in accordance with design specifications. If a transistor could be fabricated such that the design specifications are exactly met in all aspects, such a transistor would be an "ideal" transistor. However, during the actual fabrication process of the Gilbert cell 310, where the Gilbert cell transistors are fabricated onto a single integrated circuit (IC) chip, it is virtually impossible to fabricate transistors Q1, Q2, Q3 and Q4 as ideal transistors. Even slight differences in area and doping concentrations of transistors, even at a molecular level, between the ideal transistor and the transistors Q1, Q2, Q3 and Q4 may be sufficient to cause differences in performance between each of the transistors Q1, Q2, Q3 and Q4 and the ideal transistor. When a bias current is conducted through the Gilbert cell 310 (FIG. 3), the performance differences in the transistors Q1, Q2, Q3 and Q4 results in an inherent static DC offset. This static DC offset can be corrected by a conventional static DC offset loop at the output of the mixer. However, an additional DC term appears at the mixer output only when a large signal is present. The large signal may be either the communication signal of interest or an interferer signal. When the strength of the communication signal of interest is adequate, the even-order nonlinearities in the mixer are a second order problem. Thus, the DC signal present in the communication signal of interest overwhelms any additional DC signal produced by the even-order effects and the circuit operates properly. However, if the desired communication signal of interest is small and the interferer signal is large, then the problem of even-order nonlinearities becomes significant. The resulting DC offset from the interferer signal interacting with the even-order nonlinearities can dominate the desired DC signal. This dynamic, interferor signal-dependent DC offset severely degrades the noise figure of the receiver and/or saturate succeeding stages in the communication device. These effects are undesirable in receivers. This exacerbated effect caused by the mismatch between the transistors Q1, Q2, Q3 and Q4 with the ideal transistor is referred to as the even-order nonlinearity effect.

Figure 4:
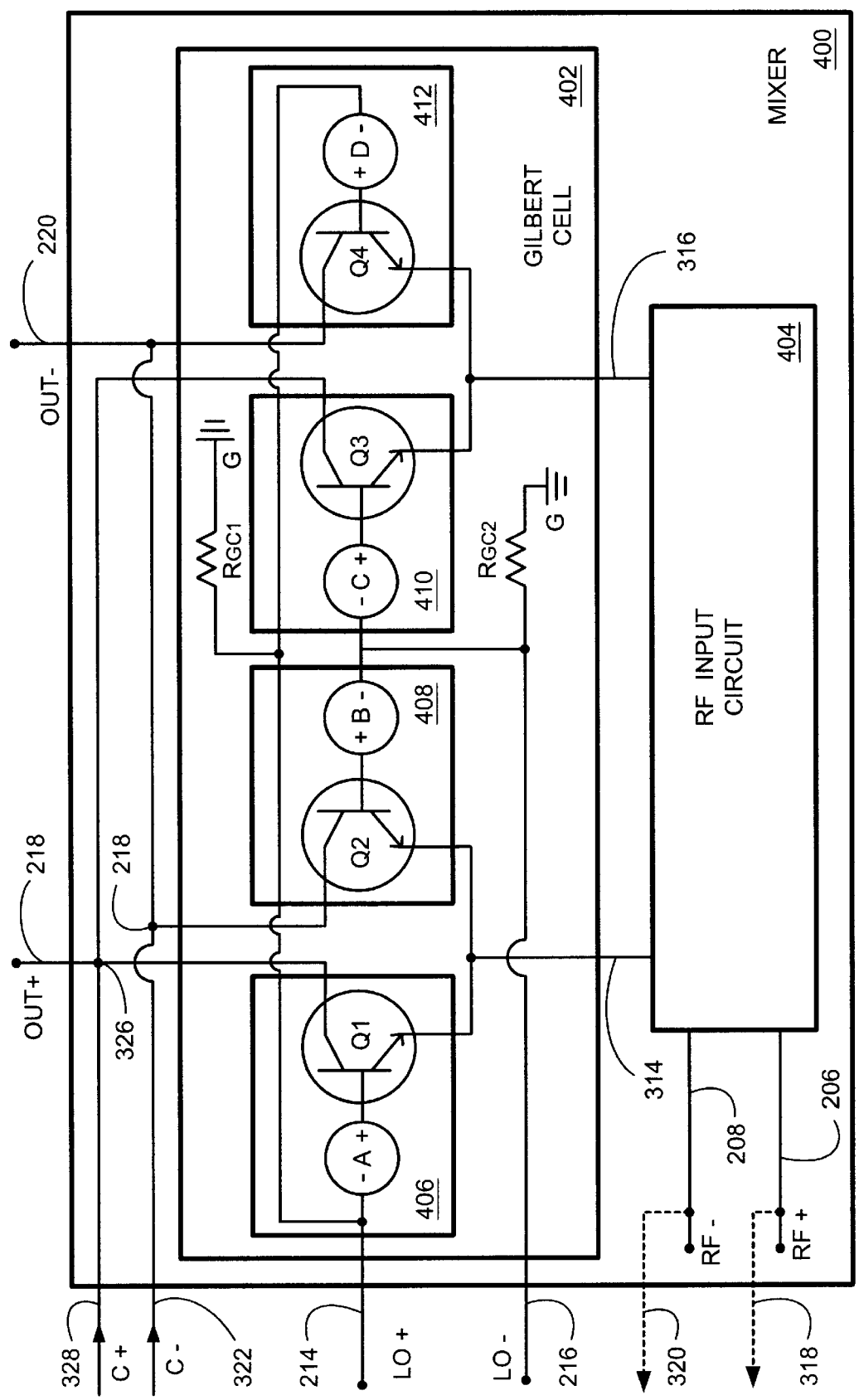
FIG. 4 is a block diagram showing an ideal mixer of FIGS. 2 and 3.

FIG. 4 is a block diagram showing a mixer 400 having a Gilbert cell 402 and an RF input circuit 404. The connections of the mixer 400, the Gilbert cell 402, and the RF input circuit 404 are configured substantially in accordance with the connections illustrated in FIG. 3. Thus, connection reference numerals in FIG. 4 correspond with the connection reference numerals of FIG. 3 for convenience of illustration and for explaining the operation and functionality of the Gilbert cell 402 having ideal transistors.

Gilbert cell 402 has four ideal transistors 406, 408, 410 and 412. Ideal transistor 406 is equivalent to transistor Q1 plus an off-nominal term A (having a positive polarity associated with the base of transistor Q1). Thus, ideal transistor 406 illustrated in FIG. 4 and transistor Q1 of FIG. 3 differ by the off-nominal factor A. Similarly, ideal transistor 408 differs from transistor Q2 (FIG. 3) by the off-nominal factor B. Ideal transistor 410 differs from transistor Q3 (FIG. 3) by the off-nominal factor C and ideal transistor 412 differs from transistor Q4 (FIG. 3) by the off-nominal factor D.

In the figures shown, the LO signals and RF signals may be voltage quantities, while the output signal may be a current. Alternatively, the signals could be any combination of currents and voltages. For the example shown, the equation below mathematically describes the functionality and operation of the ideal Gilbert cell 402. The differential current $I_{OUT}$ is equal to the differential of OUT+ and OUT−. In a Gilbert cell 402 having ideal transistors 406, 408, 410 and 412, each of the transistors will be identical and therefore operate exactly the same. In the ideal setting, transistors Q1, Q2, Q3 and Q4 would be each fabricated as an ideal transistor. In this ideal setting, the off-nominal factors A, B, C and D would then be equal to zero (or alternatively, equal to each other).

$$I_{out} = \frac{I_{ed}(A-B-C+D) + 2I_{ec}(A-B+C-D)}{V_t} + \frac{2RI_{ed}I_{1d} + \frac{4RI_{ed}I_{ec}(B+C-A-D) + 2RI_{ed}^2(B+D-A-C)}{\beta V_t}}{V_t + \frac{4R}{\beta}I_{ec}}$$

In accordance with the equation above, if the terms A, B, C and D are equal to zero (or equal to each other), non-ideal components drop out and the ideal component remains. However, in the situation where transistor Q1 (FIG. 3) does not equal the ideal transistor 406 (FIG. 4), the off-nominal factor A will not be equal to zero. Similarly, if the transistors Q2, Q3 and Q4 (FIG. 3) are not equal to the ideal transistors 408, 410 and 412 (FIG. 4), respectively, then the off-nominal factors B, C and D, respectively, will also be non-zero. Thus, one skilled in the art will appreciate that the output of the Gilbert cell 402 as described by the equation above will be non-ideal and will have a signal-dependent, or dynamic, DC offset.

In the equation above, the term Ied is equal to the differential of the RF signal currents, that correspond to RF+ and RF−, respectively. Likewise, the term $I_{1d}$ corresponds to the differential current of the LO signals, that correspond to LO+ and LO−. The term $I_{ec}$ corresponds to the common mode current, the average of $I_{E1}$ and $I_{E2}$. This current is equal to the bias current ($I_{E+}$) on connection 218 and the bias current ($I_{E−}$) on connection 220.

The current gain in the equation above for the transistors is represented by the symbol β. This current gain β for a transistor is known as the collector current divided by the base current.

$V_t$ in the equation above is the threshold voltage of the transistors. A resistor R in the equation above is equal to $R_{GC\ 1}$ and $R_{GC\ 2}$ residing in the Gilbert cell 402 (FIG. 4). Resistors $R_{GC\ 1}$ and $R_{GC\ 2}$ are assumed to be equal for purposes of the equation above.

Several observations can be made concerning the above equations. First, an ideal mixing term is present: $2RI_{ed}I_{1d}$. Second, the differential output current has a term that contains a square dependence on the differential input current:

$$\approx 2RI^F_{ed}(b+d-a-c)/\beta V_t^2.$$

Therefore, using the trigonometric identity $\cos^2(\theta) = \frac{1}{2} + \frac{1}{2}\cos(2\theta)$, a DC offset is present that varies with strength of the interferor signal. Third, even though the square dependent term is divided by β (typically a large number that is greater than 100), the communication signal of interest is often 80 dB or more below the interferer signal. Thus, the interferer signal dependent DC offset is still problematic. Comparing the differences between the Gilbert cell 310 (FIG. 3) and the Gilbert cell 402 (FIG. 4) having ideal transistors, one skilled in the art will appreciate that two sources of DC offset arise in the mixing of the incoming RF communication signal that are not easily compensated for with conventional techniques or conventional circuitry. One skilled in the art will appreciate that the above equation makes no mention to any 'leakage' signal. The equation only deals with transistor mismatch. Second is the effect of the slight differences between the transistors Q1, Q2, Q3 and Q4 from the ideal transistor (the even-order nonlinearity effect). The DC offset compensator 210 (FIGS. 2 and 3) detects the presence of the interferer signal and compensates the undesirable effects of the interferor self-mixing and even-odd nonlinearity effect of the transistors in the Gilbert cell 310.

The ability of the DC offset compensator 210 to compensate DC offset associated with both the interferor self mixing and the even-order nonlinearities of the transistors provides at least two significant benefits over conventional mixers that are not compensated by the DC offset compensator 210. First, the even-order nonlinearity caused by the transistors in the Gilbert cell 310 is a result of fabrication differences between each transistor. Thus, the performance of the transistors in every Gilbert cell produced will not only be different from the performance of a Gilbert cell having ideal transistors, each of the Gilbert cells in any particular mobile communication device 100 will be different from the Gilbert cells employed in other mobile communication devices. Thus, the DC offset compensator 210 allows the DC offset associated with the even-order nonlinearities in each individual Gilbert cell to be compensated individually.

Second, the DC offset compensator 210 provides for the detection of interferor signals present in the incoming RF communication signal and provides for the compensation of the undesirable interferer self mixing DC offset occurring in the Gilbert cell 310. The interferor signal is often in close spectral proximity to the communication signal of interest. Because the frequency of operation is typically large (greater than 1 GHz), selectively passing the communication signal of interest while sufficiently attenuating accompanying interfering signals is difficult using conventional technology. Therefore, the interferor is present at the mixer. The interferer signal is later separated from the RF communication signal of interest after passing through the mixer 204 so that the communication signal of interest can be further processed, for example, but not limited to, into a communication signal that is transmitted to the baseband section that is heard by the user of the mobile communication device 100 (FIG. 1).

4. Detecting the Interferor Signal.

Detector 306 (FIG. 3) is coupled to connections 206 and 208 that provide for input of the incoming RF communication signal (RF+ and RF−). The incoming RF communication signal will have at least the communication signal of interest, such as, but not limited to, the voice of a person communicating with the user of the mobile communication device 100 (FIGS. 1 and 2). When the incoming RF communication signal has the communication signal of interest as its only component, the communication signal of interest is downmixed by mixer 204 such that a differential output signal (OUT+ and OUT−) can be further processed with a high degree of efficiency and accuracy.

However, when the incoming RF communication signal contains the communication signal of interest and one or more interferor signals, the output differential signal from mixer 204, in the absence of DC offset compensator 210, is more difficult, if not nearly impossible, to process because of the DC offset caused by interferor self mixing and because of the even-order nonlinearity effect of the transistors in the Gilbert cell 310. When the magnitude of the communication signal of interest sufficiently exceeds the magnitude of any interferor signals, the desired communication signal is downmixed with the LO signal by mixer 204 such that the output differential signal (OUT+ and OUT−) is processed with reasonable efficiency and accuracy. But, when the magnitude of the interferor signal exceeds the magnitude of the communication signal of interest, difficulties in processing the desired communication signal after downmixing may be encountered. The detector 306 detects when any large signal is present. If the signal is an interferor signal, then the compensation is beneficial. However, if the large signal is the communication signal of interest, the compensation only slightly degrades the quality of the DC information in the mixer output signal, and the associated noise figure will suffer somewhat. But in this case, the signal is large since the user is necessarily close in proximity to the transmitter. Therefore, the noise figure of the receiver in this case is of little consequence. Thus, in the worst case scenario when the interferor signal is larger than the desired signal, DC offset compensator 210 improves the quality of the differential output signal (OUT+ and OUT−) by compensating for the DC offset caused by the interferor signal(s), thereby improving the efficiency and accuracy of the further processing of the desired communication signal of interest.

Detector 306 may employ any of the well known means for detecting differences between the communication signal of interest and an interferor signal(s) present on the incoming RF communication signal. For example, detector 306 may monitor the magnitude of the incoming RF communication signal (such as the voltage of RF+ and RF−) and respond to any significant increases in the voltage of the incoming RF communication signal that tends to indicate the presence of an interferor signal having a greater magnitude than the desired communication signal of interest. Detector 306, in another embodiment, is configured to monitor the different channels of the incoming RF communication signal to differentiate between the channel used by the communication signal of interest and channels having interferer signals. Other embodiments of detector 306 may be implemented using well known components and techniques, or a combination of components and techniques, such that interferor signals present on the incoming RF communication signal can be detected. Any such detector means may be implemented in a DC offset compensator 210 without departing substantially from the functionality and operation of the DC offset compensator 210.

Furthermore, for convenience of illustration in FIG. 3, detector 306 is shown residing in the DC offset compensator 210. Detector 306 may also reside in alternative convenient locations outside of the DC offset compensator 210, as a component of other systems, or as a stand-alone dedicated detector 306, without adversely affecting the operation and functionality of the DC offset compensator 210. Also, for convenience of illustration in FIG. 3, detector 306 is shown coupled to connections 208 and 206, via connections 320 and 318, respectively. Detector 306, in an alternative embodiment, may be coupled to other connections residing in the mobile communication device 100 (FIGS. 1 and 2) so that an interferer signal(s) may be detected. Any such alternative embodiments in detector 306 are intended to be within the scope of this disclosure and to be protected by the accompanying claims.

Controller 304 is responsive to detector 306 when the presence of interferor signals are detected in the incoming RF communication signal. Detector 306 provides a suitable output signal corresponding to the detected interferer signal, over connection 322, to controller 304 such that controller 304 can actuate correction generator 302 to generate the compensation signals ($I_{C+}$ and $I_{C-}$) that compensate the DC offset(s) resulting from the interferor self mixing. One skilled in the art will realize that the detailed operation and description of individual components used in detector 306 need not be described in detail so long as a suitable output signal is provided by detector 306 to controller 304. Any such variations in the components used in detector 306, and the operation of those components in detector 306 that generate a suitable output signal for controller 304 are intended to be within the scope of this disclosure and to be protected by the accompanying claims.

5. Successive Approximation Algorithm

Figure 5:
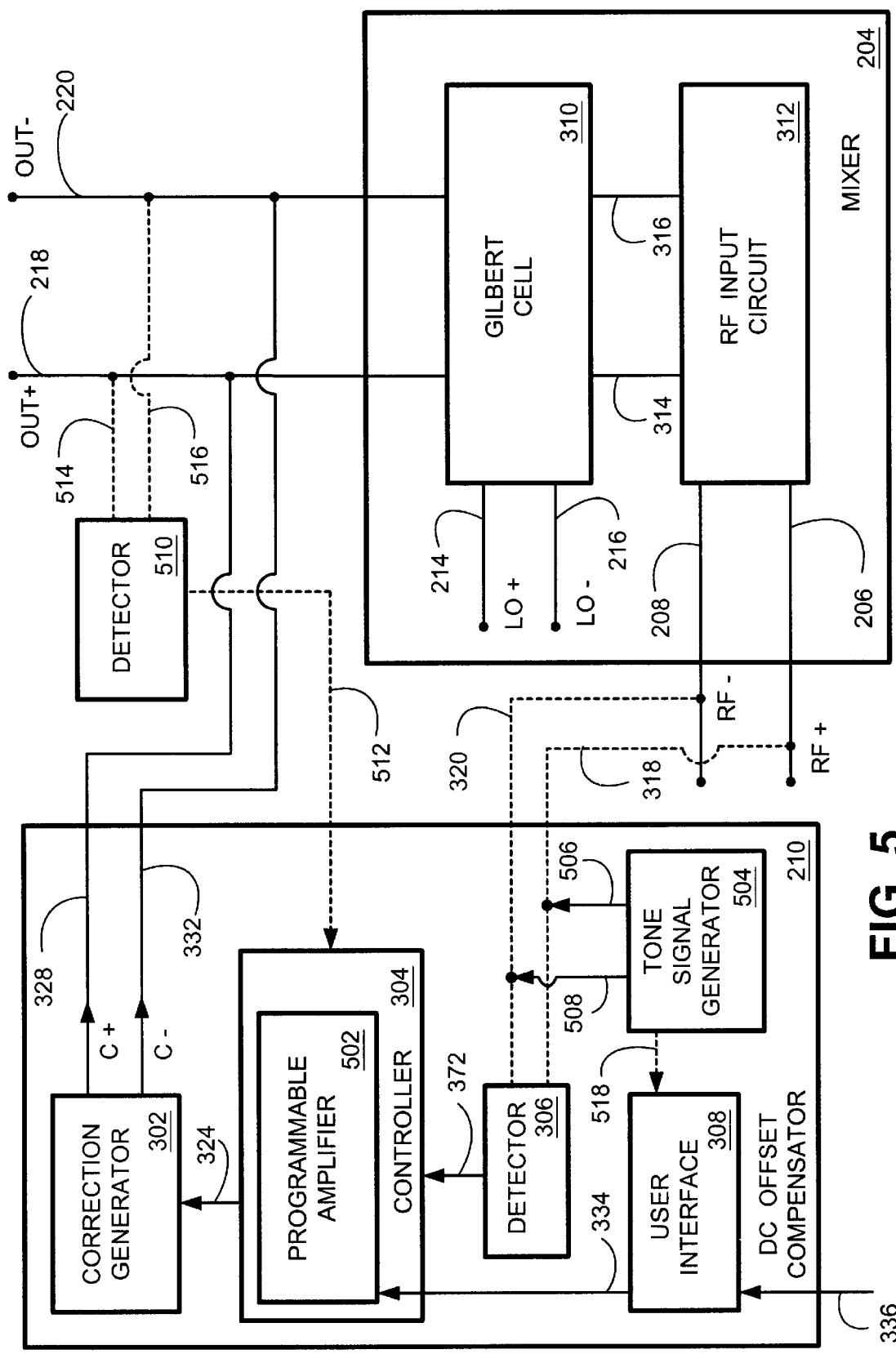
FIG. 5 is a block diagram illustrating a controller of FIG. 3 implemented with a programmable amplifier.

FIG. 5 is a block diagram illustrating a controller 304 (see also FIG. 3) implemented with a programmable amplifier 502. Controller 304, using information provided by detector 306, provides a suitable signal to correction generator 302, via connection 324, such that a compensating signal (C+ and C−) is generated to compensate the DC offsets caused by the interferor self mixing. In one embodiment, controller 304 is implemented by a programmable amplifier 502. A successive approximation algorithm, described below, is used to specify the amplification levels for the programmable amplifier 502.

Operating parameters for programmable amplifier 502 may be specified during the manufacturing process by providing the operating specifications through user interface 308. During the manufacturing process, a person or device inputs the operating specifications, via connection 336, into the DC offset compensator 210. User interface 308 provides a suitable signal corresponding to the operating specifications for programmable amplifier 502 via connection 334.

In another embodiment, user interface 308 is simply an interface point between connections 334 and 336. In such an embodiment, the user or device provides the operating specifications for programmable amplifier 502 in a suitable format.

In an embodiment of controller 304 that employs a programmable amplifier 502, the operating specifications provided by the user or device through user interface 308 specifies the status of the amplification control bits of the programmable amplifier 502. The status of these amplification control bits (1 or 0) are determined by executing the successive approximation algorithm described below. The least significant bit (LSB) control bit of the programmable amplifier 502 specifies the smallest incremental amount of amplification for the programmable amplifier 502. Similarly, the most significant bit (MSB) control bit specifies the greatest amount of incremental amplification for the programmable amplifier 502. The programmable amplifier 502 typically has a plurality of amplification control bits to specify the amplification of the programmable amplifier 502. Thus, the plurality of control bits are set to either an "on" condition or an "off" condition. For example, the "on" condition may correspond to a setting of the bit to a logical high or a "1" state. Similarly, the "off" condition may correspond to a setting of the bit to a logical low or a "0" state.

As an illustrative example, programmable amplifier 502 has four amplification bits to control the amplification. The amplifier 502 provides a maximum amplification of 15 times the amplification of the LSB when the four control bits are each set to the "on" condition (represented as a binary number 1111, where the most left-hand bit is the MSB). Alternatively, other amplification levels could be specified by selectively setting control bits to the "off" condition. For example, an amplification level of 5 may be specified by setting the fourth control bit (the MSB bit) and the second control bit to the "off" condition (0101).

Alternative embodiments of controller 304 may employ programmable amplifiers having any suitable number of amplification control bits for controlling the amplification of the programmable amplifier 502. Any such alternative embodiment of controller 304 employing a programmable amplifier 502 as described above in DC offset compensator 210 (FIGS. 2 and 3) may be implemented in and may be calibrated according to the successive approximation algorithm described below without departing from the operation and functionality of the invention, and are intended to be included within the scope of this disclosure and to be protected by the accompanying claims.

Figure 6:
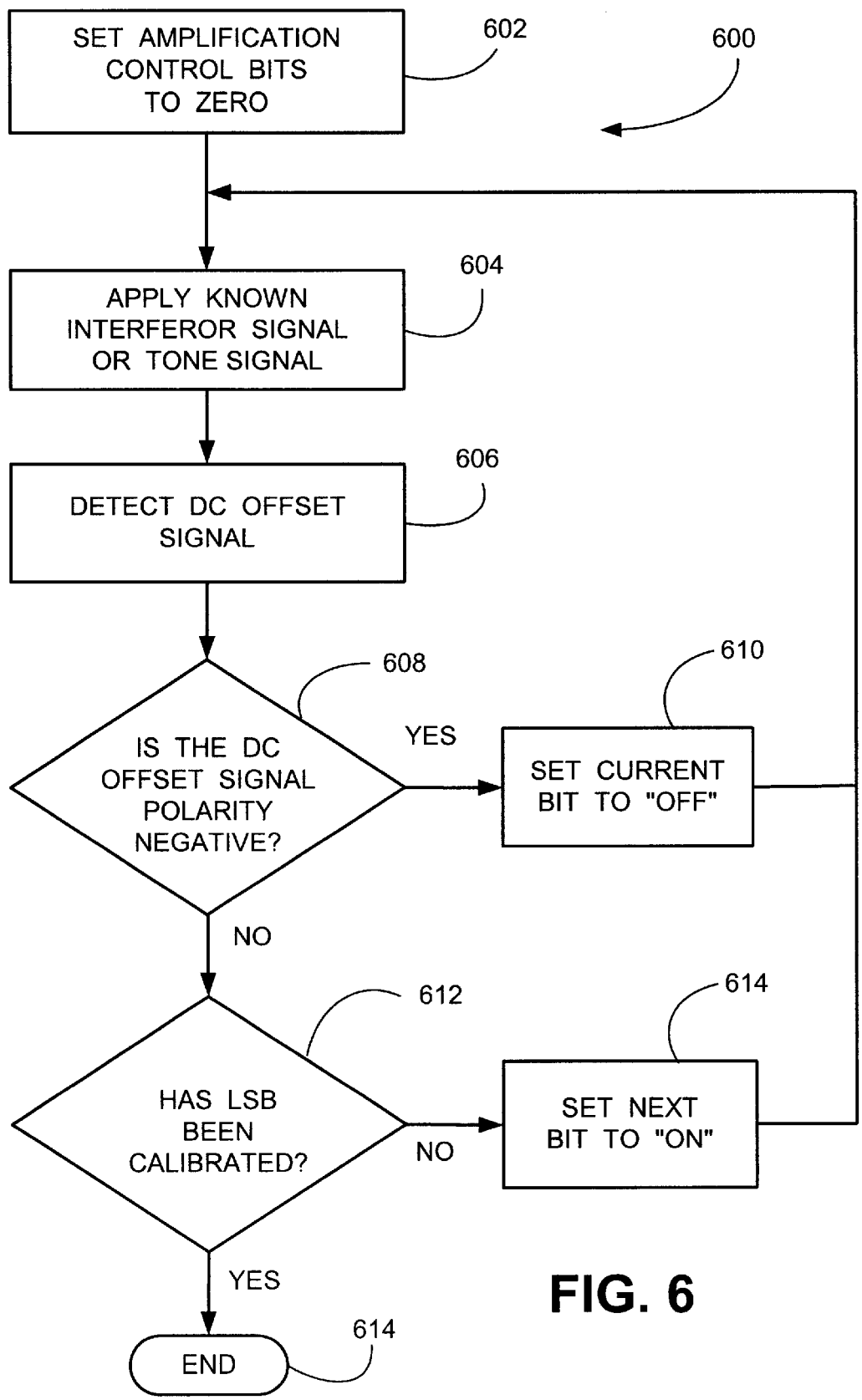
FIG. 6 is a flow chart illustrating the implementation of the successive approximation algorithm for calibrating a programmable amplifier residing in the controller of FIG. 3.

FIG. 6 is a flow chart 600 illustrating the implementation of the successive approximation algorithm for determining the amplification control bit conditions (calibrating) of a programmable amplifier 502 (FIG. 5) residing in controller 304. In this regard, each block may represent a module, segment, or portion of code, that comprises one or more executable instructions for implementing the specified logical function(s). It is also noted that in some alternative implementations, the functions noted in the blocks may occur out of the order noted in FIG. 6, or may include additional functions without departing significantly from the functionality and operation of the successive approximation algorithm employed by a DC offset compensator. For example, two blocks shown in succession in FIG. 6 may in fact be executed substantially concurrently, the blocks may sometimes be executed in reverse order, or some of the blocks may not be executed in all instances, depending upon the functionality involved, as will be further clarified below. Furthermore, other algorithms other than the successive approximation may be used to provide calibration. All such modifications and variations are intended to be included within the scope of this disclosure and to be protected by the accompanying claims.

The successive approximation algorithm illustrated by flow chart 600 begins at block 602 where all control bits are set to the "off" condition. In one embodiment, the process begins at block 602 during the manufacturing process of the mobile communication device 100 (FIGS. 1 and 2).

At block 604, a known interferor signal is applied over connections 318 and 320 (FIG. 5). In one embodiment, a known tone signal generated by tone signal generator 504 (FIG. 5) simulates an interferer signal on connections 318 and 320 (FIG. 5), via connections 506 and 508 (FIG. 5), respectively. Thus, the applied known interferer signal or tone signal is detected by the detector 306. The applied known interferer signal or tone signal propagates onto connections 206 and 208 (FIG. 5) to simulate the effect of an interferor signal that causes an interferor leakage signal on connections 214 and 216 (FIG. 5). As described below, tone signal generator 504, or a similarly functioning device, generates a plurality of known interferor signals or tone signals such that each of the known interferer signals or tone signals are substantially equivalent to each other.

This known interferor signal or tone signal may be applied to connections 206 and 208 (FIG. 5) in a variety of manners without departing substantially from the functionality and operation of the successive approximation algorithm illustrated in flow chart 600 (FIG. 5). In one embodiment, the known interferer signal or tone signal may be generated by a tone signal generator 504 (FIG. 5) that is not part of the DC offset compensator 210 or that is not part of the mobile communication device 100 (FIGS. 1 and 2). Such a tone signal generator could generate a known interferer signal or tone signal for broadcasting over the RF spectrum to be detected by antenna 110 (FIGS. 1 and 2), and thereby communicated onto connections 206 and 208. In another embodiment, the known interferor signal or tone signal is provided at a convenient alternative location, such as at a connector point (not shown) located directly on the connectors 206 and 208, or directly into user interface 308 (via connection 518 in FIG. 5, shown as a dashed line to indicate this alternative embodiment). Any such embodiment of the tone signal generator 504 when employed in the calibration process of the DC offset compensator 210 is intended to be within the scope of this disclosure and be protected by the accompanying claims.

At block 606 (FIG. 6), the DC offset signal induced by the known interferor signal or tone signal is detected on the output connections 218 and 220 (FIG. 5) by a second detector 510 (FIG. 5). A suitable detector 510 is employed such that a determination may be made as to whether or not the polarity of the output DC offset has reversed, as shown at block 608 (FIG. 6). If the polarity of the DC offset signal has not reversed from a positive voltage to a negative voltage (the NO condition), the process proceeds to block 612. However, if the polarity of the DC offset signal has reversed from a positive voltage to a negative voltage (the YES condition), the process proceeds to block 610 and the MSB is set to the "off" condition. The process then proceeds back to block 604 where tone signal generator 504 (FIG. 5) generates another similar known interferer signal or tone signal. The DC offset signal is detected at block 606 and tested again at block 608. Since at this stage of the successive approximation algorithm the polarity of the DC offset signal is positive, the process proceeds to block 612.

If, at block 612, if the LSB has not yet been tested (the NO condition), the process proceeds to block 614 where the next significant control bit is set to an "on" condition. The process then returns to block 604. Thus, the most recently set bit is tested to determine if the polarity of the DC offset has reversed from positive to negative.

However, if the LSB has been tested (the YES condition), the process proceeds to block 614 and ends. All bits have been set (calibrated) to either an "on" or an "off" condition. Thus, the above-described process is repeated in an iterative manner for each of the control bits of the programmable amplifier 502 (FIG. 5). When the LSB control bit has been set to either the "on" condition or the "off" condition, the successive approximation algorithm has been completed and the process ends at block 614. For convenience of illustration and for explaining the operation and functionality of the successive approximation algorithm according to the flow chart 600 (FIG. 6), detector 510 (FIG. 5) is shown to reside outside of the DC offset compensator 210. In another embodiment, detector 510 is included as an integral component of the DC offset compensator 210. Detector 510 is coupled to controller 304 with connection 512 and coupled to the output of mixer 204 via connections 514 and 516. Detector 510 provides a suitable signal to controller 304 that is used to compare the detected DC offset with the LSB control bit.

An embodiment having detector 510 directly coupled to controller 304 via connection 512 would be particularly suitable for an embodiment that calibrates the amplification control bits of the programmable amplifier 502 at specified times. For example, the calibration process according to the successive approximation algorithm in one embodiment is initiated each time the mobile communication device 100 (FIGS. 1 and 2) is activated by the user. Alternatively, the successive approximation algorithm is initiated in another embodiment at predefined intervals while the mobile communication device 100 is in use. Yet another embodiment initiates the successive approximation algorithm to calibrate the amplification control bits of the programmable amplifier 502 upon the occurrence of a predefined event, such as, but not limited to, the detection of an interferer signal above a predefined threshold or some other monitored operating condition within the mobile communication device 100.

Alternatively, detector 510 could be coupled to a user interface (not shown) such that the person or device performing the successive approximation algorithm knows the condition of the DC offset signal during each stage of the testing process according to the successive approximation algorithm illustrated by flow chart 600 (FIG. 6). The user or device then specifies, through user interface 308, the status of each amplification control bit (either the "on" condition or the "off" condition) for the programmable amplifier 502. Such an embodiment would be particularly suited for an embodiment that is adjusted only one time during the manufacturing process.

Figure 7:
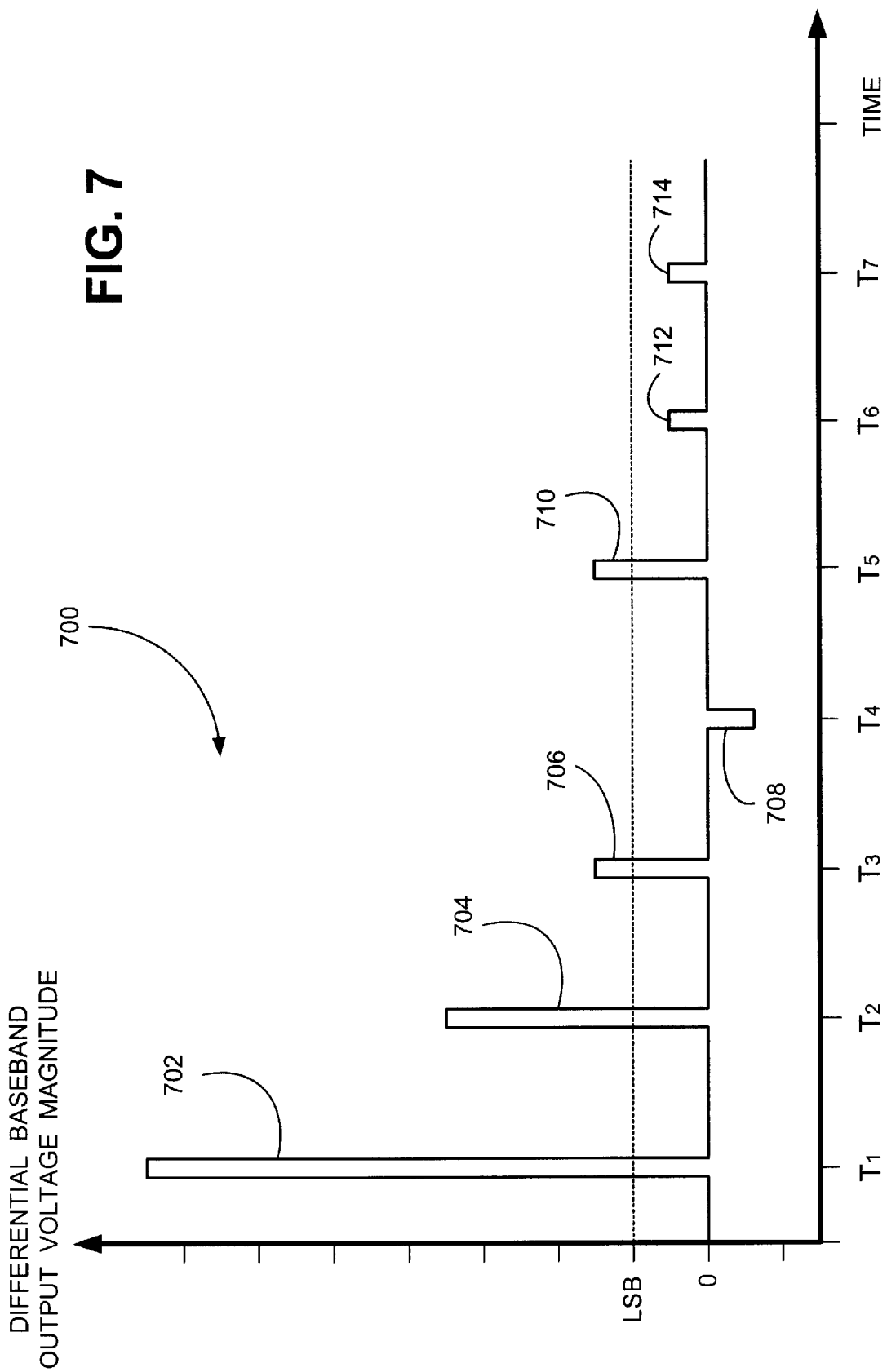
FIG. 7 is a graph of the DC offset signal of the mixer of FIGS. 2 and 3 when the programmable power amplifier of FIG. 5 residing in the DC offset compensator of FIGS. 2, 3 and 5 is calibrated to compensate for DC offset caused by interferer leakage signals.

FIG. 7 is a graph 700 of the DC offset signal of mixer 204 (FIGS. 2, 3 and 5) when the amplification control bits of the programmable power amplifier 502 (FIG. 5) residing in an exemplary DC offset compensator 210 (FIGS. 2, 3 and 5) are calibrated to compensate for dynamic DC offsets. The graph 700 illustrates a simplified exemplary calibration process of a programmable amplifier having four amplification control bits. For purposes of the exemplary calibration process described below, the known interferer signal or tone signal results in amplification control bit settings to the binary number 1101 (where the most left-hand bit is the MSB).

For purposes of conveniently illustrating the detected DC offset signals, the signal amplitude axis has not been numbered. Similarly, the time axis has been labeled with generic times, $T_1$–$T_7$. One skilled in the art will realize that any appropriate axis numbering system could have been employed, and that such a numbering system is not necessary to explain the operation and functionality of the successive approximation algorithm according to flow chart 600 (FIG. 6) as performed by the tone signal generator 504, detector 510 and controller 304 during the calibration of the amplifier control bits of the programmable amplifier 502 (FIG. 5).

At time $T_1$, tone signal generator 504 (FIG. 5) generates a known interferer signal or tone signal as described above. Detector 510 (FIG. 5) detects the resulting DC offset, illustrated by pulse 702 (FIG. 7). The successive approximation algorithm is initiated such that the MSB control bit is actuated to an "on" condition. Then, according to the process of flow chart 600 (FIG. 6), an interferer signal or tone signal at time $T_2$ is generated by the tone signal generator 504. The resulting pulse 704 is detected by detector 510. In this hypothetical example of the calibration of the amplifier control bits of the programmable amplifier 502, pulse 704 is illustrated as having a magnitude greater than the LSB amplification magnitude and as having a positive polarity. The difference in the magnitude between pulse 702 and 704 corresponds to the turning on of the MSB control bit. Therefore, after the MSB control bit is actuated into the "on" condition, a signal is provided by controller 304 to the pulse generator 302 such that a compensating signal (C+ and C−) is generated to compensate for a portion of the DC offset caused by blocker self mixing or blocker interaction with even order nonlinearities.

Next, because pulse 704 has a magnitude greater than the amplification of the LSB and has a positive polarity, the successive approximation algorithm operates to adjust the next most significant control bit to the "on" condition. A known interferor signal or tone signal is generated by tone signal generator 504 at time $T_3$ and the resulting DC offset signal is detected by detector 510, as represented by pulse 706. Pulse 706 is illustrated as having a magnitude greater than the amplification of the LSB and a positive polarity. Therefore, during the next iteration of the successive approximation algorithm, the next control bit of the programmable amplifier 502 is set to the "on" condition.

At time $T_4$, the tone signal generator 504 generates another known interferor signal or tone signal and the resulting DC offset signal is detected by detector 510. As illustrated by pulse 708, the detected DC offset signal has a negative polarity. Because the polarity of the detected DC offset has reversed (become negative), the successive approximation algorithm, according to flow chart 600 (FIG. 6), initiates the resetting of the most recently set control bit back to the "off" condition. The interferer signal or tone signal is generated by tone signal generator 504 and the resulting DC offset signal is detected by detector 510 at time $T_5$, as illustrated by pulse 710. Pulse 706 and pulse 710 are illustrated as having equal magnitude and polarity, as would be expected because the control bits of programmable amplifier 502 during the times $T_3$ and $T_5$ are the same.

Next, according to the successive approximation algorithm, the LSB control bit is adjusted. At time $T_6$, a known interferer signal or tone signal is generated by tone signal generator 504 and the resulting DC offset signal is detected by detector 510, as represented by pulse 712. Pulse 712 is illustrated as having an amplitude that is less than the amplification of the LSB and as having a positive polarity. Therefore, according to the successive approximation algorithm, the four amplification control bits of the programmable amplifier 502 have been specified (1101) such that the programmable amplifier 502 is calibrated. The process then ends.

In another embodiment, at time $T_7$, a known interferor signal or tone signal is generated by the tone signal generator 504 and the resulting DC offset signal is detected by detector 510, as illustrated by pulse 714. Pulse 714 is substantially equal to pulse 712, therefore indicating that the calibration of the programmable amplifier 502 has been successfully implemented.

In yet another embodiment, the known interferor signal or tone signals is generated by the tone signal generator 504 at selected times or at periodic times to further verify the proper calibration of the programmable amplifier 502, and re-calibrates the amplification control bits as necessary to optimize the compensation provided by DC offset compensator 210. The operating characteristics of components residing in the DC offset compensator 210 and/or the mixer 204 (FIGS. 2 and 3) may have changed since the last calibration, for example, but not limited to, due to changes in temperature. Such an embodiment would be particularly suited for mobile communication devices 100 (FIGS. 1 and 2) that have programmable amplifier 502 calibrated when the mobile communication device 100 is turned on, or when a periodic known interferor signal or tone signal is generated to provide periodic recalibration of the programmable amplifier 502.

6. Alternative Embodiments

Figure 8:
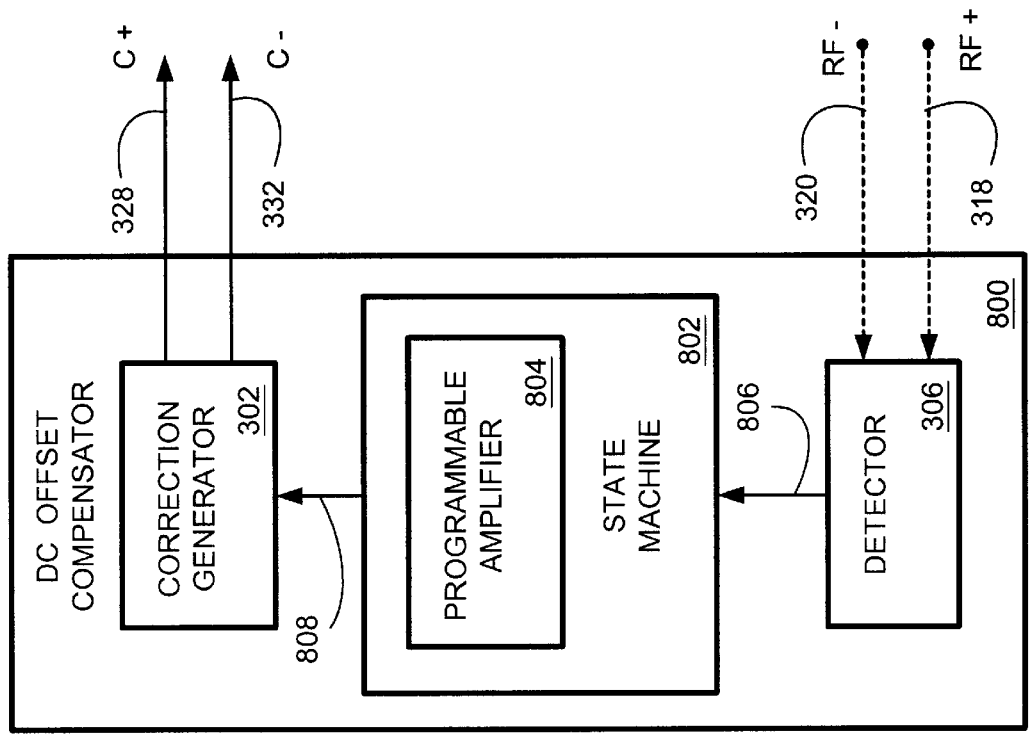
FIG. 8 is a block diagram of an embodiment of the DC offset compensator employing a state machine controller.

FIG. 8 is a block diagram of an embodiment of the DC offset compensator 800 employing a state machine controller 802. DC offset compensator 800 includes at least a correction generator 302, a detector 306 and state machine 802. DC offset compensator 800 may include other optional components, not shown for convenience of illustration, as described above. For example, a user interface may be included and be coupled to state machine 802 in a manner similar to the user interface 308 (FIG. 3) coupled to the controller 304 (FIG. 3).

State machine 802 includes a programmable amplifier 804. Detector 306 detects the presence of an interferer signal, as described above, and provides a suitable input signal corresponding to the detected interferer signal to state machine 802 via connection 806. State machine 802 is configured to control the amplification and calibration of the programmable amplifier 804. When an interferer signal is detected, the state machine 802 provides a suitable control signal to correction generator 302, via connection 808, so that the correction generator 302 generates the compensating correction signals (C+ and C−) to compensate for the DC offset caused by the interferer self mixing and blocker interaction with even order nonlinearities in the mixer (not shown). Accordingly, DC offset compensator 800 could include a tone signal generator and detector (not shown for convenience of illustration) coupled to the DC offset compensator 800 and that operate substantially in accordance with the tone signal generator 504 (FIG. 5) and the detector 510 (FIG. 5) described above. Thus, programmable amplifier 804 operates substantially in accordance with the programmable amplifier 502 (FIG. 5) and is calibrated substantially according to the process illustrated by flow chart 600 (FIG. 6) described above.

Alternatively, state machine 802 may be configured without the programmable amplifier 804. In such an embodiment, state machine 802 is configured to provide a suitable control signal to correction generator 302 over connection 808.

State machine 802 may be implemented as firmware, or a combination of hardware and firmware. When implemented as hardware, state machine 802 is constructed with commonly available components well known in the art. For example, but not limited to, state machine 802 may be implemented as a suitable configuration of transistors on an integrated circuit (IC) chip. One skilled in the art of designing and implementing state machine 802, with or without the programmable amplifier 804, will appreciate that many alternative configurations of the components (not shown) residing in a state machine 802 may be implemented having the above-described functionality and operation, and that such embodiments are too numerous to conveniently describe in detail. Any such implementations of state machine 802 in the DC offset compensator 800 are intended to be within the scope of this disclosure and be protected by the accompanying claims for the DC offset compensator.

Figure 9:
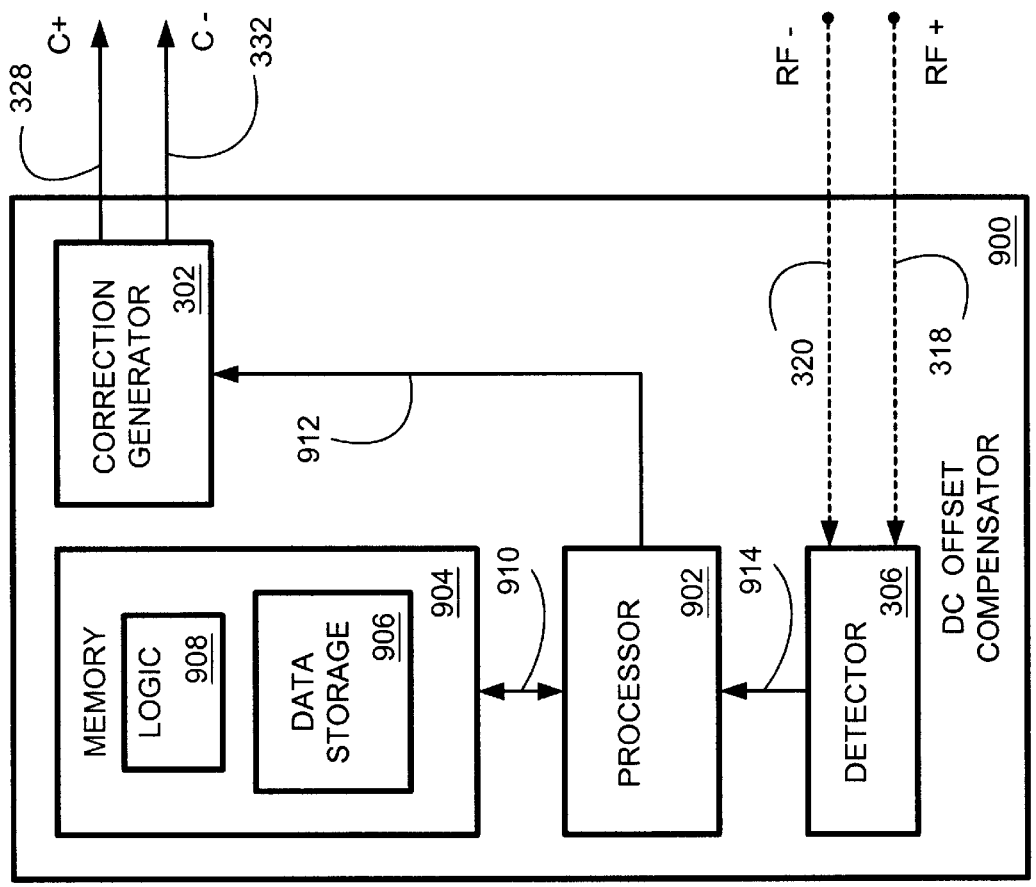
FIG. 9 is a block diagram of an embodiment of the DC offset compensator employing a processor.

FIG. 9 is a block diagram of an embodiment of the DC offset compensator 900 employing a processor 902. DC offset compensator 900 also includes detector 306, correction generator 302 and memory 904. Memory 904 includes a region for data storage 906 and a region for logic 908. Processor 902 is coupled to and communicates with memory 904 over connection 910. DC offset compensator 900 may include other optional components, not shown for convenience of illustration, as described above. For example, a user interface may be included and be coupled to processor 902 in a manner similar to the user interface 302 (FIG. 3) coupled to the controller 304 (FIG. 3).

Upon the detection of an interferer signal by detector 306, as described above, processor 902 provides a suitable control signal to correction generator 302, over connection 912, such that correction generator 302 generates a compensating signal (C+ and C−) to compensate the DC offset caused by the interferer leakage signal. Processor 902, for convenience of illustration, is shown as residing within the DC offset compensator 900. Alternatively, processor 902 may reside in alternative convenient locations outside of the DC offset compensator 900, as a component of other systems, or as a stand-alone dedicated processor, without adversely affecting the operation and functionality of the DC offset compensator 900. In one embodiment, processor 902 is constructed as a special purpose processor and fabricated as part of the DC offset compensator 900 that is constructed on a single IC chip. In another embodiment, processor 902 is a commercially available processor. Examples of commercially available processors include, but are not limited to, an ARM processor such as an ARM 7 or ARM 9 processor, a ZSP Core supplied by LSI Logic or a Teak processor supplied by DSP Group. Processor 902 controls the execution of logic 908. Logic 908 is configured to determine a suitable control signal provided by processor 902 to correction generator 302. Logic 908 is configured substantially in accordance with the flow chart 600 (FIG. 6) for the successive approximation algorithm described above. However, logic 908 instructs processor 902 to incrementally decrease the DC offset caused by a known interferer signal or tone signal by a suitable predefined incremental amount. Also, the iterative process of logic 908 for reducing the DC offset proceeds until the DC offset is reduced to at least a predefined threshold (rather than the amplification magnitude of the LSB according to block 608 of FIG. 6). Accordingly, DC offset compensator 900 includes a tone signal generator and detector (not shown for convenience of illustration) coupled to the DC offset compensator 900 and that operates substantially in accordance with the tone signal generator 504 (FIG. 5) and the detector 510 (FIG. 5) described above.

When logic 908 is implemented as software and stored in memory 904, one skilled in the art will appreciate that logic 908 can be stored on any computer readable medium for use by or in connection with any computer and/or processor related system. In the context of this document, a memory 904 is a computer readable medium that is an electronic, magnetic, optical, or other physical device or means that contains or stores a computer and/or processor program. Logic 908 can be embodied in any computer readable medium for use by or in connection with an instruction executed system, apparatus, or device, such as a computer-based system, processor-based containing system, or other system that can fetch the instruction from the instruction execution system, apparatus, or device and execute the instructions associated with logic 908. In the context of this specification, a "computer readable medium" can be any means that can store, communicate, propagate, or transport the program associated with logic 908 for use by or in connection with the instruction execution system, apparatus, and/or device. The computer readable medium can be, for example, but not limited to, an electronic, magnetic, optical, electromagnetic, infrared, or semi-conductor system, apparatus, device, or propagation medium. More specific examples (a non-exhaustive list) of the computer readable medium includes the following: an electrical connection having one or more wires, a portable computer diskette, (magnetic) a random access memory (RAM), a read-only memory (RAM), an erasable programmable read-only memory (EEPROM), or Flash memory, an optical fiber, and a portable compact disk read-only memory (CDROM). Note that the computer readable medium could even be paper or another suitable medium upon which the program associated with logic 908 is printed, as the program can be electronically captured, via for instance optical scanning of the paper, or other medium, then compiled, interpreted or otherwise processed in a suitable manner if necessary, and then stored in memory 904.

Figure 10:
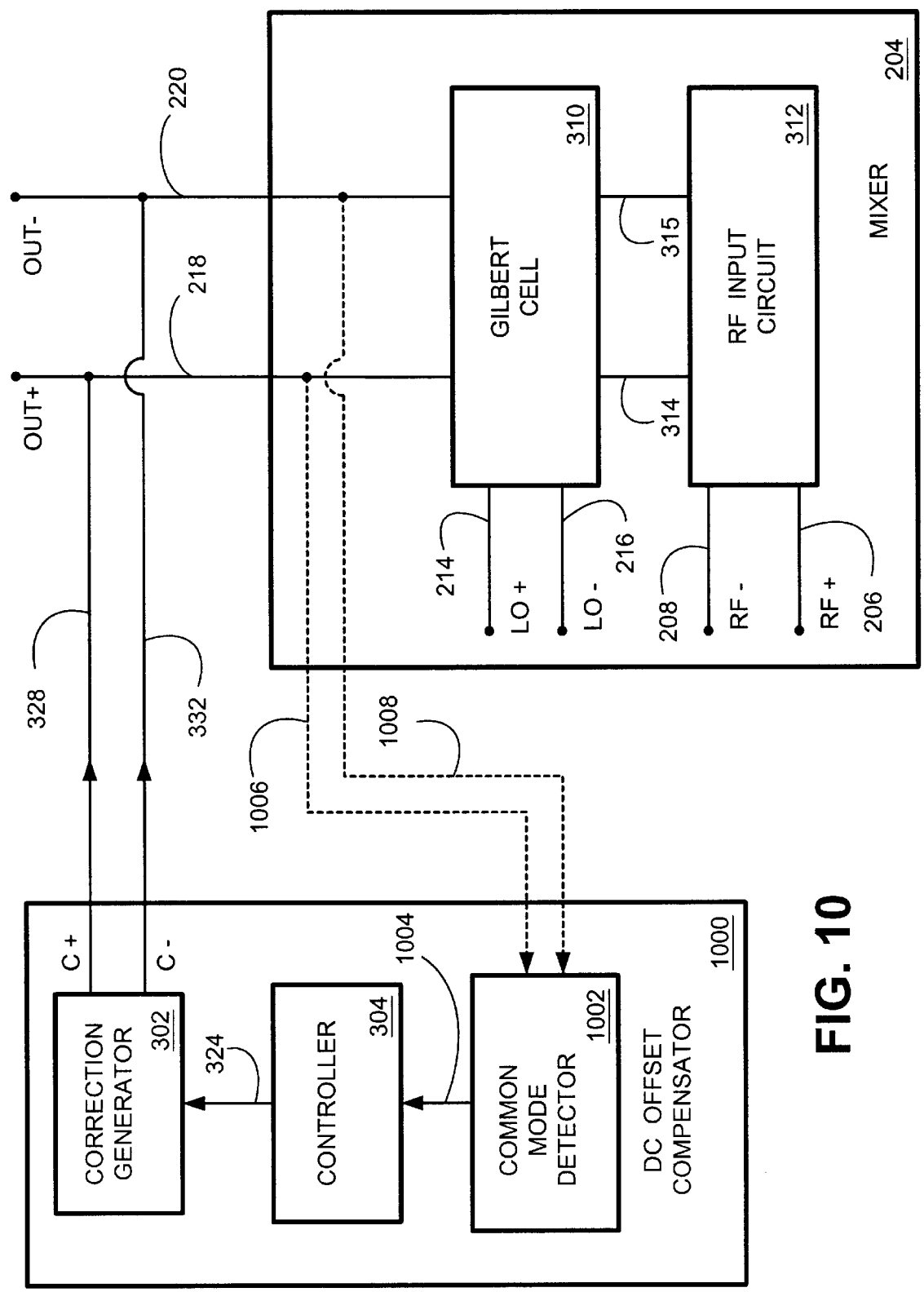
FIG. 10 is a block diagram of an embodiment of the DC offset compensator configured to detect DC offset caused by interferor leakage signals with a common mode current detector.

FIG. 10 is a block diagram of an embodiment of the DC offset compensator 1000 configured to detect DC offset caused by interferor self mixing with a common mode detector 1002. Common mode detector 1002 is coupled to controller 304, via connection 1004. Common mode detector 1002, in a manner described below, provides a suitable signal to controller 304 that is similar to the suitable signal provided by detector 306 (FIGS. 3 and 5) provided to controller 304 described above. Common mode detector 1002 may be employed equally well with the other embodiments of the DC offset compensator described above in that the common mode detector 1002, upon the detection of the presence of an interferor signal present in an incoming RF communication signal, provides a suitable signal to the elements residing in the other embodiments of the DC offset compensator such that the DC offset caused by an interferer leakage signal is compensated for. Furthermore, common mode detector 1002, for convenience of illustration, is shown residing in the DC offset compensator 1000. Common mode detector 1002 may reside in alternative convenient locations outside of the DC offset compensator 1000, as components of other systems, or as a stand-alone dedicated detector without adversely affecting the operation and functionality of the DC offset compensator 1000. Any such alternative embodiments of the common mode detector 1002 are intended to be within the scope of this disclosure and be protected by the accompanying claims.

Another embodiment of common mode detector 1002 detects a shift in the average common mode. Upon detecting a shift in the average common mode, as described below, common mode detector 1002 provides a suitable signal to controller 304 so that DC offset caused by interferer self mixing may be compensated for by the DC offset compensator 1000.

Figure 11:
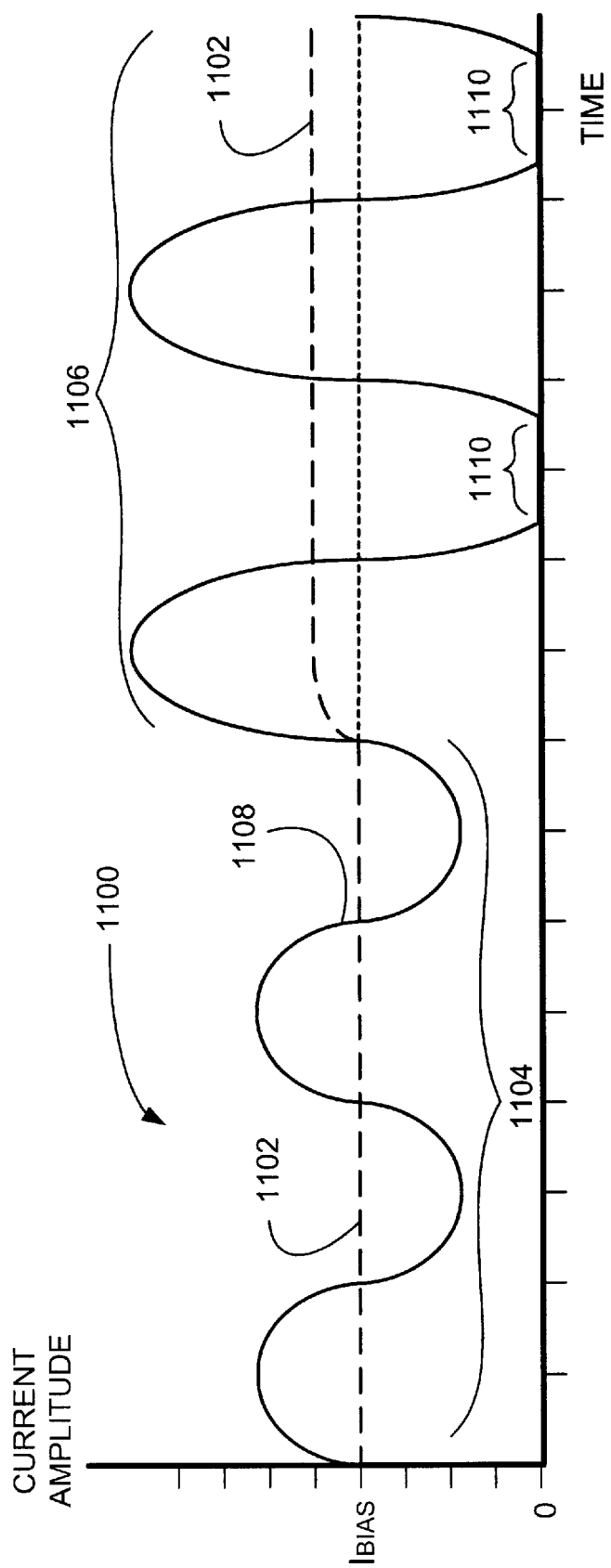
FIG. 11 is a simplified illustrative graph showing the average common mode current detected by an embodiment of the common mode current detector of FIG. 10.

FIG. 11 is a simplified graph 1100 showing the average common mode 1102 detected by an embodiment of the common mode detector 1002. For purposes of conveniently illustrating the detected average common mode 1102, the signal amplitude axis has not been numbered. Similarly, the time axis has not been numbered. One skilled in the art will realize that any appropriate axis numbering system could have been employed, and that such an axis numbering system is not necessary to explain the operation and functionality of the common mode detector 1002 (FIG. 10) that detects shifts in the average common mode 1102 as described below.

A first portion 1104 of the average common mode 1102 is illustrated as having an average value that is equal to the bias current ($I_{OUT}$). Thus, in this simplified hypothetical example, this first portion 1104 is intended to represent the average common mode 1102 associated with an incoming RF communication signal that does not have any interferer signals present.

A second portion 1106 of the common mode 1102 is illustrated as having shifted upwards slightly from the value of the bias current. In this simplified illustrative hypothetical example, the second portion 1106 is intended to represent the average common mode 1102 associated with an incoming RF communication signal that includes an interferor signal that causes an undesirable DC offset that is to be compensated for by the DC offset compensator 1000 (FIG. 10). The upward shift in the average common mode 1102 is caused by the clipping of the sinusoidal common mode 1108, as indicated by portions 1110. The clipping occurs because the current is not able to become negative (reverse polarity) due to the configuration of the components in the associated mixer 204 (FIG. 11). Thus, when an interferor signal is present having a magnitude sufficiently large to cause the above-described clipping of the common mode 1108 (see portions 1110), the common mode detector 1002 configured to detect shifts in the average common mode 1102 detects the presence of the interferer signal and compensates for the undesirable DC offset in the manner described above.

For convenience of describing the operation and functionality of the DC offset compensator, the DC offset compensator was described as being employed in a mobile communication device 100 (FIGS. 1 and 2) such that undesirable DC offset caused by interferer self mixing are compensated for in a mixer 204 (FIG. 2). Alternative embodiments of the DC offset compensator may be employed in other devices in which undesirable dynamic DC offset is present. For example, but not limited to, a DC offset compensator is implemented in receivers associated with televisions, radios, stereo amplifiers, satellite receivers, and other receivers employed in a variety of devices where it is desirable to compensate DC offset. Any such implementation of a DC offset compensator employed in a device having a receiver for the purpose of compensation of dynamic interferor dependent DC offset is intended to be within the scope of this disclosure and be protected by the accompanying claims for the DC offset compensator.

Furthermore, for convenience of describing the operation and functionality of the DC offset compensator, the DC offset compensator was described as being coupled to a mixer and configured to compensate for DC offset caused by interferor self mixing occurring in the mixer. Alternative embodiments of the DC offset compensator are configured to detect incoming signals in other devices that may be subject to dynamic DC offset, and accordingly, be configured to compensate for those undesirable DC offset. Any such implementation of a DC offset compensator coupled to another device for the purpose of compensating for DC offset caused interferor self mixing within that device are intended to be within the scope of this disclosure and be protected by the accompanying claims for the DC offset compensator.

While various embodiments of the invention have been described, it will be apparent to those of ordinary skill in the art that many more embodiments and implementations are possible that are within the scope of this invention.

What is claimed is:

1. A system for compensating direct current (DC) offset signals induced in an electronic mixer circuit, comprising:

a detector configured to detect a communication signal, the detector coupled to an input of the electronic mixer circuit and configured to generate a detect signal when an interferor signal component residing in the communication signal is detected;

a controller coupled to the detector and configured to generate a control signal upon receiving the detect signal from the detector; and a correction generator coupled to an output of the electronic mixer circuit, the correction generator configured to add a compensation signal to an output signal from the electronic mixer circuit upon receiving the control signal from the controller, such that a DC offset signal component residing in the output signal of the electronic mixer circuit, the DC offset signal component being associated with the interferor signal, is reduced.

2. The system of claim 1, wherein an input connector of the electronic mixer circuit is electromagnetically coupled to a second connector of the electronic mixer circuit, such that the interferor signal induces an interferor leakage signal into the second connector such that the DC offset signal is generated in the electronic mixer circuit.

3. The system of claim 2, wherein the electronic mixer circuit is a Gilbert mixer residing in a communication device.

4. The system of claim 2, further comprising a programmable amplifier residing in the controller, the programmable amplifier configured to generate the control signal to the correction generator.

5. The system of claim 4, further comprising:

a tone signal generator coupled to the detector and the electronic mixer circuit, the tone signal generator configured to generate a tone signal that simulates the interferor signal when actuated; and a second detector coupled to the output of the electronic mixer circuit and coupled to the controller, the second detector configured to detect a tone DC offset signal in the output signal from the electronic mixer circuit, the tone DC offset signal being associated with the generated tone signal, and further configured to provide a tone detect signal to the controller upon the detection of the tone DC offset signal such that the controller provides a calibration signal to the programmable amplifier that specifies an amplification for the programmable amplifier.

6. The system of claim 2, wherein the controller is a state machine.

7. The system of claim 2, wherein the detector is coupled to the output of the electronic mixer circuit and is configured to detect a change in a common mode component residing in the output signal of the electronic mixer circuit, such that the detector generates the detect signal when the change exceeds a predefined threshold.

8. A method for compensating direct current (DC) offset signals induced in an electronic mixer circuit, comprising the steps of:

detecting a communication signal input into an electronic mixer circuit;

determining if an interferor signal component resides in the detected communication signal;

generating a compensating signal that corresponds to a DC offset signal associated with the interferor signal; and combining the compensating signal with an output signal of the electronic mixer circuit so that the DC offset signal is reduced.

9. The method of claim 8, wherein an input connector of the electronic mixer circuit is electromagnetically coupled to a second connector of the electronic mixer circuit, such that the interferor signal component induces an interferor leakage signal into the second connector such that the DC offset signal is generated in the electronic mixer circuit.

10. The method of claim 9, further comprising the steps of adjusting the compensating correction for fabrication differences between a plurality of transistors residing in the electronic mixer circuit, the fabrication differences between each one of the plurality of transistors causing operating differences between each one of the plurality of transistors such that a magnitude of the DC offset signal is increased.

11. The method of claim 9, further comprising the steps of:

generating a tone signal with a tone signal generator coupled to the electronic mixer circuit, the tone signal configured to simulate the interferor signal component;

detecting a tone DC offset signal associated with the tone signal;

adjusting the compensating signal such that the DC offset signal is reduced; and specifying at least one operating parameter for a controller that controls a compensating signal generator that generates the compensating signal according to the step of adjusting the compensating signal.

12. The method of claim 9, wherein the step of determining if an interferor signal component resides in the detected communication signal further comprises the steps of:

coupling a detector to an output of the electronic mixer circuit;

configuring the detector to detect a common mode signal component residing in the output signal of the electronic mixer circuit; and comparing the detected common mode signal component with a predefined threshold so that the step of generating the compensating signal is commenced when the detected common mode signal component exceeds the predefined threshold.

13. The method of claim 9, wherein the step of determining if an interferor signal component resides in the detected communication signal further comprises the steps of:

coupling a detector to an output of the electronic mixer circuit;

configuring the detector to detect an average common mode signal component residing in the output signal of the electronic mixer circuit;

comparing the detected common mode signal component with a predefined threshold so that the step of generating the compensating signal is commenced when the detected average common mode signal component exceeds the predefined threshold.

14. A system for compensating direct current (DC) offset signals induced in an electronic mixer circuit, comprising:

means for detecting a communication signal input into the electronic mixer circuit;

means for determining if an interferor signal component resides in the detected communication signal;

means for generating a compensating signal that corresponds to a DC offset signal associated with the interferor signal; and means for combining the compensating signal with an output signal of the electronic mixer circuit so that the DC offset signal is reduced.

15. The system of claim 14, wherein an input connector of the electronic mixer circuit is electromagnetically coupled to a second connector of the electronic mixer circuit, such that the interferor signal component induces an interferor leakage signal into the second connector such that the DC offset signal is generated in the electronic mixer circuit.

16. The system of claim 15, further comprising means for adjusting the compensating signal for fabrication differences between a plurality of transistors residing in the electronic mixer circuit, the fabrication differences between each one of the plurality of transistors causing operating differences between each one of the plurality of transistors such that a magnitude of the DC offset signal is increased.

17. The system of claim 15, further comprising:

means for generating a tone signal with a tone signal generator coupled to the electronic mixer circuit, the tone signal configured to simulate the interferor signal component;

means for detecting a tone DC offset signal associated with the tone signal;

means for adjusting the compensating signal such that the tone DC offset signal is reduced; and means for specifying at least one operating parameter for a controller that controls a compensating signal generator that generates the compensating signal according an adjustment made by the means for adjusting the compensating signal.

18. The system of claim 15, wherein the means for determining if the interferor signal component resides in the detected communication signal further comprises:

means for coupling a detector to an output of the electronic mixer circuit;

means for configuring the detector to detect a common mode signal component residing in the output signal of the electronic mixer circuit;

means for comparing the detected common mode signal component with a predefined threshold so that the means for generating the compensating signal is actuated when the detected common mode signal component exceeds the predefined threshold.

19. The system of claim 15, wherein the means for determining if an interferor signal component resides in the detected communication signal further comprises:

means for coupling a detector to an output of the electronic mixer circuit;

means for configuring the detector to detect an average common mode signal component residing in the output signal of the electronic mixer circuit;

means for comparing the detected average common mode signal component with a predefined threshold so that the means for generating the compensating signal is actuated when the detected average common mode signal component exceeds the predefined threshold.

20. A system for compensating direct current (DC) offset signals induced in electronic mixer circuits, comprising:

a wireless communication device having an electronic mixer circuit configured to mix a received radio frequency (RF) communication signal with a local oscillator signal;

a detector configured to detect the RF communication signal, the detector coupled to an input of the electronic mixer circuit and configured to generate a detect signal when an interferor signal component residing in the RF communication signal is detected;

a controller coupled to the detector and configured to generate a control signal upon receiving the detect signal from the detector; and a correction generator coupled to an output of the electronic mixer circuit, the correction generator configured to add a compensation signal to an output signal from the electronic mixer circuit upon receiving the control signal from the controller, such that a DC offset signal component residing in the output signal of the electronic mixer circuit, the DC offset signal component being associated with the interferor signal, is reduced.

21. The system of claim 20, wherein the wireless communication device is a cellular telephone.

* * * * *

UNITED STATES PATENT AND TRADEMARK OFFICE
CERTIFICATE OF CORRECTION

PATENT NO.    : 6,535,725 B2
DATED         : March 18, 2003
INVENTOR(S)   : Hatcher et al.

It is certified that error appears in the above-identified patent and that said Letters Patent is hereby corrected as shown below:

Column 8,
Line 1, after the word "term", delete the word "led", and substitute therefor -- $I_{ed}$ --.

Signed and Sealed this

Twenty-ninth Day of July, 2003

JAMES E. ROGAN
*Director of the United States Patent and Trademark Office*